United States Patent [19]
Bohling et al.

[11] Patent Number: 5,124,278
[45] Date of Patent: Jun. 23, 1992

[54] AMINO REPLACEMENTS FOR ARSINE, ANTIMONY AND PHOSPHINE

[75] Inventors: David A. Bohling, Emmaus; Gregory T. Muhr, Allentown; Sherri L. Bassner, Lansdale, all of Pa.

[73] Assignee: Air Products and Chemicals, Inc., Allentown, Pa.

[21] Appl. No.: 586,845

[22] Filed: Sep. 21, 1990

[51] Int. Cl.$^5$ ............................................. H01L 21/20
[52] U.S. Cl. ...................................... 437/126; 156/610;
156/614; 437/133; 437/949; 437/945; 437/81;
536/70; 427/248.1; 427/255.1; 148/DIG. 16;
148/DIG. 41; 148/DIG. 56; 148/DIG. 65
[58] Field of Search ................... 148/DIG. 16, 41, 56,
148/65, 110, 119; 156/610–615; 556/70;
427/248.1, 252, 253, 255.1; 437/81, 85, 87, 88,
133, 126, 949, 945

[56] References Cited

U.S. PATENT DOCUMENTS

| | | | |
|---|---|---|---|
| 4,721,683 | 1/1988 | Ward | 437/20 |
| 4,734,514 | 3/1988 | Melas et al. | 556/70 |
| 4,904,616 | 2/1990 | Bohling et al. | 437/81 |
| 4,935,381 | 6/1990 | Speckman et al. | 437/81 |
| 4,965,222 | 10/1990 | Staring | 156/613 |
| 4,981,814 | 1/1991 | Nelson et al. | 437/81 |
| 4,988,640 | 1/1991 | Bohling et al. | 437/81 |
| 5,015,747 | 5/1991 | Hostalels et al. | 556/1 |

FOREIGN PATENT DOCUMENTS

0206764  6/1986  European Pat. Off. .

OTHER PUBLICATIONS

S. S. W. Price, et al.; "The Pyrolysis of Trimethylarsine"; *Canadian Journal Chemistry*; vol. 48; (1970) pp. 3209–3212.

P. B. Ayscough et al.; "Kinetics of the Pyrolysis of Trimethylarsine Tristrifluoromethylarsine and Related Compounds"; *Journal of the Chemical Society*; (1954) pp. 3381–3388.

G. R. A. Brandt, et al.; "Organumetallic and Urganometalloidal Fluorine Compounds Part V, Trifluoromethyl Compounds of Arsenic"; *Journal of the Chemical Society*; 1952; pp. 2552–2555.

H. J. Emeleus, et al.; "Organometallic and Organometalloidal Fluorine Compounds, Part VI, Trifluoromethyl Arsenicals"; *Journal of the Chemical Society*; 1952; pp. 1552–1564.

F. W. Bennett, et al.; "Organumetallic and Organometalloid Fluorine Compounds, Part VII, Trifluoromethyl Compounds of Phosphorus"; *Journal of the Chemical Society*; 1953; pp. 1565–1571.

W. R. Cullen; "Perfluoroalkyl Arsenicals, Part I, The Prepartion of Alkyl Perfluoroalkyl Arsenicals"; *Canadian Journal of Chemistry*; vol. 38; 1960; pp. 439–443.

W. R. Cullen; "Perfluoroalkyl Arsenicals, Part II, The Preparation and Properties of Aryl Perfluoroalkyl Arsenicals"; *Canadian Journal of Chemistry*; vol. 38, 1960; pp. 445–451.

M. J. Ludowise, et al.; "Use of Column V Alkyls in Organometallic Vapor Phase Epitaxy (OMVPE)"; *SPIE*; vol. 323; Semiconductor Growth Technology (1982); pp. 117–124.

M. J. Cherng, et al.; "GaAs$_{1-x}$Sb$_x$ Growth by OMVPE"; *Journal of Electronic Materials*; vol. 13; No. 5; 1984; pp. 799–813.

D. M. Spoeckman, et al.; "Alternatives to Arsine: The Atmospheric Pressure Organumetallic Chemical Vaper Deposition Growth of GaAs Using Triethylarsenic"; *Applied Physics Letter*; vol. 50 (11); 16 Mar. 87; pp. 676–678.

C. H. Chen, et al.; "Use of Tertiary Butyl Arsine yu GaAs Growth"; *Applied Physics Letter*; vol. 50 (4); 26 Jan 87; pp. 218–220.

R. M. Lum, et al.; "Use of Tertiary Butyl Arsine W the Metalorganic Chemical Vapor Deposition Growth of GaAs"; *Applied Physics Letter*; vol. 50 (5) 2 Feb. 57; pp. 284–286.

M. J. Cherng, et al.; *Journal of Crystal Growth*; 77; (1986) pp. 408–417; "MOVPE Growth of GaInAsSb".

G. J. Bougnot, et al.; "Growth of Ga$_{1-x}$Al$_x$Sb and Ga$_{1-x}$In$_x$Sb by Organometallic Chemical Vapor Deposition", *Journal of Crystal Growth*; 77 (1986); 392–399.

R. M. Biefield; "The Preparation of InAs$_{1-x}$Sb$_x$ Alloys and Strained-Layer Super-Lattices by MOCVD"; *Journal of Crystal Growth*; 77 (1986); 400–407.

(List continued on next page.)

*Primary Examiner*—Robert Kunemund
*Attorney, Agent, or Firm*—Geoffrey L. Chase; James C. Simmons; William F. Marsh

[57] ABSTRACT

The present invention addresses the use of metalorganic amines as metallic donor source compounds in reactive deposition applications. More specifically, the present invention addresses the use of the amino-substituted metallic donor source compounds M(NR$_2$)$_{3-x}$H$_x$, where R is organic, alkyl or fluoroalkyl, and x is less than or equal to 2, and M=As, Sb or P, in processes requiring deposition of the corresponding element. These uses include a number of different processes; the metalorganic vapor phase epitaxy of compound semiconductor material such as GaAs, InP, AlGaAs, etc.; doping of SiO$_2$ or borosilicate based glasses to enhance the reflow properties of the glass; in-situ n-type doping of silicon epitaxial material; sourcing of arsenic or phosphorus for ion implantation; chemical beam epitaxy (or MOMBE); and diffusion doping into electronic materials such as silicon dioxide, silicon and polycrystalline silcon. These types of materials generally have high volatilities, low toxicities, labile metal-ligand bonds, and stable decomposition products.

Specifically, the use of tris(dialkylamino) arsenic (As(NR$_2$)$_3$) as a substitute for arsine in the manufacture of silicon integrated circuits, Group III-V compound semiconductors, optoelectronics and other electronic devices has been identified.

47 Claims, No Drawings

OTHER PUBLICATIONS

J. H. Comfort, et al.; "In-Situ Arsenic Doping of Epitaxial Silicon at 800° C. by Plasma Enhanced Chemical Vapor Deposition"; *Applied Physics Letter;* 51 (19), 9 Nov. 87; pp. 1536–1538.

J. S. Mercier; "Rapid Flow of Doped Glasses for VLSIC Fabrication"; *Solid State Technology;* Jul. 1987; pp. 85–91.

R. M. Lum, et al.; "Investigation of Carbon Incoporation in GaAs Using $^{13}$C-Enriched Trimethylarsenic and $^{13}$CH$_4$"; *Journal of Electronics Materials;* vol. 17; No. 2; (1988); pp. 101–104.

R. M. Lum, et al.; "Investigation of Triethylarsenic as a Replacement for Arsine in the Metalurganic Chemical Vapor Deposition of GaAs"; *Applied Physics Letter;* vol. 52; (18); 02 May 1988.

A. Trumsun Carli, et al.; "Metal Organic Vapor Phase Epitaxy of GaAs: Raman Studies of Complexes Formation"; *Revue Physical Applications;* vol. 20; (1985); pp. 569–574.

Chapter 5 From *VLSI Technology* edited by Sze; pp. 169–217 (1983).

B. Swaminathan, et al.; "Diffusion of Arsenic in Polycrystalline Silicon"; *Applied Physics Letter;* 40(a); May 1982.

T. Kook, et al.; "Diffusion of Dupants in (III) Silicon During High Temperature Heat Treatment in Nitrogen"; pp. 83–88, Materials Research Society Symposium Proc.; vol. 36 (1985).

W. T. Tsang; "Chemical Beam Epitaxy of InP and GaAs"; *Applied Physics Letter;* vol. 45; No. 11; 01 Dec. 84; pp. 1234–1236.

W. T. Tsang; "Chemical Beam Epitaxy of InGaAs"; *Journal of Applied Physics;* 58(3); Aug. 1985; pp. 1415–1418.

H. Kroemer; MBE Growth of GaAs on Si Problems and Progress; "Material Research Society Symposium Proceedings"; (67); (1986); pp. 3–14.

Abernathy, C. A. et al; "Growth of High Quality AlGaAs by Metalurganic Molecular Beam Epitaxy Using Trimethylamine Alane"; *Applied Physics Letter;* vol. 56 (26); pp. 2654–2656, 25 Jun. 1990.

Lappert, et al.; "Metal and metalloid Amides"; Ellis Horwood, Ltd.; 1980; Ch. 6 & 7; pp. 382–464.

5,124,278

AMINO REPLACEMENTS FOR ARSINE, ANTIMONY AND PHOSPHINE

TECHNICAL FIELD

The present invention is directed to methods for reactive deposition of selected Group VA metals using improved sources of such metal which lower toxicity and alleviate inadvertent contamination of end products. More specifically, the present invention is a method for supplying arsenic, phosphorus or antimony for epitaxial compositions, doping of glasses, n-type doping of silicon substrates, ion implantation, and diffusion.

BACKGROUND OF THE PRIOR ART

Arsenic and phosphorus compounds which are used in doping and thin film deposition processes in the manufacture of silicon and compound semiconductor devices are extremely toxic and present handling hazards in their storage, distribution and use. For example arsine which is extensively used in doping operations for the manufacture of silicon integrated circuits and in the deposition of arsenic in chemical vapor deposition processes associated with the manufacture of gallium-arsenic devices is one of the most toxic substances known to man. It has a Lowest Concentration (LC50), wherein 50% of a sample population dies, of approximately 5 ppm translating to a Threshold Limit Value, which is the highest level allowed by law for an 8 hour workday, (TLV) of 50 ppb. Arsine is shipped and stored as a high pressure gas, which increases its potential hazard as a atmospheric contaminant. Because of this toxicity, extensive safety precautions and fail-safe equipment must be built in to processes where arsine is used. Additionally, local and national environmental laws and regulations are being enacted to further control arsine's use, shipment and storage.

In order to avoid the toxicity problems associated with arsine and phosphine, alkyl Group V organometallics have been used as sources for these corresponding elements. Tertiary butyl arsine ($H_2As[t-C_4H_9]$), diethylarsine ($HAs[C_2H_5]_2$), and trimethylarsine ($As[CH_3]_3$) have been tested as arsine substitutes, among other alkyl arsines. These materials are somewhat less toxic than arsine. Tertiary butyl arsine has a Threshold Limit Value (TLV) equal to 80 ppb and a Lowest Concentration (LC50) equal to 70 ppm. Toxicity trends generally decrease with increased alkyl substitution. These materials will deposit arsenic in chemical vapor deposition processes, but are less desirable because they also can lead to co-deposition of carbon which is detrimental to the electrical performance of the final device.

Decomposition of Group VA organometallic and fluorinated derivatives are reported by S. J. W. Price et al, "The Pyrolysis of Trimethylarsine", *Canadian Journal Chemistry*, vol. 48, (1970) pp 3209–3212; and by P. B. Ayscough et al, "Kinetics of the Pyrolysis of Trimethylarsine, Tristrifluoromethylarsine and Related Compounds; *Journal of the Chemical Society*, (1954) pp 3381–3388.

In ion implantation doping applications, arsenic metal is sometimes used as the source. Heated to temperatures sufficient for sublimation, the vapor is directed to the implanter. However a more volatile source is usually preferred and arsine is still used in most applications.

U.S. Pat. No. 4,734,514 is directed to the use of hydrocarbon-substituted analogs of phosphine and arsine for various depositions and doping techniques.

Published European Patent Application 0 206 764 discloses techniques for doping glass to produce arseno-silicate glass. The glass is used as waveguide material.

G. R. A. Brandt, et al. in an article "Organometallic and Organometalloidal Fluorine Compounds Part V. Trifluoromethyl Compounds of Arsenic", *Journal of the Chemical Society*, 1952, pg. 2552–2555, reported the interaction of arsenic and trifluoroiodomethane to produce tris-trifluoromethylarsine and idobistrifluoromethylarsine.

H. J. Emeleus, et al. in an article "Organometallic and Organometalloidal Fluorine Compounds, Part VI, Trifluoromethyl Arsenicals", *Journal of the Chemical Society*, 1952, pg. 1552–1564, reports the reactions of various trifluoromethyl arsenicals to prepare the corresponding halides and related compounds. The article reports the decomposition of bis-trifluoromethylarsine to tris-trifluoromethylarsenic, arsenic metal and fluoroform. Tris-trifluoro-methylarsine was also subjected to ultraviolet light in a silica tube which resulted in a film of arsenic deposited in the cooler portions of the tube.

F. W. Bennett, et al. reported in an article "Organometallic and Organometalloidal Fluorine Compounds, Part VII, Trifluoromethyl Compounds of Phosphorus", *Journal of the Chemical Society*, 1953, pg. 1565–1571, the interaction of phosphorus and trifluoroidomethane resulted in tris-trifluoromethylphosphine.

W. R. Cullen in an article "Perfluoroalkyl Arsenicals, Part I The Preparation of Alkyl Perfluoroalkyl Arsenicals", reported in *Canadian Journal of Chemistry*, Volume 38, 1960, pg. 439–443, describes the reaction of tetramethyldiarsine with trifluoroidomethane to give dimethyltrifluoromethylarsine.

W. R. Cullen in an article "Perfluoroalkyl Arsenicals, Part II The Preparation and Properties of Aryl Perfluoroalkyl Arsenicals", reported in *Canadian Journal of Chemistry*, Volume 38, 1960, pg. 445–451, describes the reaction of iododiphenylarsine with trifluoroiodomethane to produce diphenyltrifluoromethylarsine. Thermal decomposition of diphenyltrifluoromethylarsine resulted in undisclosed black solid deposit.

In an article by M. J. Ludowise, et al. entitled "Use of Column V Alkyls in Organometallic Vapor Phase Epitaxy (OMVPE)", reported in *SPIE*, Volume 323, Semiconductor growth technology "1982", pg. 117 thru 124, the use of trimethylarsenic and trimethylantimony for deposition of Group III–V compound semiconductors is discussed. Specifically the organometallic vapor phase epitaxial reaction deposition of trialkyl alumina, gallium and indiums with trialkyl and hydrides of nitrogen, phosphorus, antimony and arsenic are disclosed.

In an article by M. J. Cherng, et al. entitled "$GaAs_{1-x}Sb_x$ Growth by OMVPE", reported in *Journal of Electronic Materials*, Volume 13, No. 5, 1984, pgs. 799 thru 813, the methods for organometallic vapor phase epitaxy using trimethyl gallium, antimony, and arsenic as source materials are disclosed. Much of the experimental results reported in the article were derived from using trimethylarsenic in contrast to arsine.

In an article by D. M. Speckman, et al. entitled "Alternatives to Arsine: the Atmospheric Pressure Organometallic Chemical Vapor Deposition Growth of GaAs Using Triethylarsenic", reported in *Applied Physics Letter*, Volume 50 (11), 16 Mar. 1987, pg. 676–678, the problem of reactant toxicity and carbon impurity contamination is highlighted in a discussion of the homo-epitaxial growth of gallium arsenide layers by organo-metallic chemical vapor deposition. The traditional use of arsine and trimethyl gallium is contrasted with the more beneficial use of triethyl gallium. The use of triethyl gallium tends to reduce the amount of incorporated carbon into the epitaxial film.

In an article by C. H. Chen, et al. entitled "Use of Tertiary Butyl Arsine for GaAs Growth", reported in *Applied Physics Letter*, Volume 50 (4), 26 Jan. 1987, pg. 218–220, the substitution of tertiary butyl arsine as a new organometallic source in replacement of arsine which results in improved organometallic vapor phase epitaxial growth with diminished carbon incorporation into the gallium arsenic layer while diminishing hazards of toxicity, purity and storage in comparison to arsine was reported.

R. M. Lum, et al., in an article entitled "Use of Tertiary Butyl Arsine in the Metal Organic Chemical Vapor Deposition Growth of GaAs", reported in *Applied Physics Letter*, Volume 50 (5), 2 Feb. 1987, pg. 284–286, again discuss the benefits of using tertiary butyl arsine in reactions to form epitaxial films of gallium-arsenide. The results are identified as being more beneficial than using an arsenic source of trimethylarsenic.

M. J. Cherny, et al., in *Journal of Crystal Growth*, 77, (1986), pp. 408–417, "MOVPE Growth of GaInAsSb", describe the use of trimethyl compounds to make the name product. Similar disclosures were made at page 392–399 of the publication by G. J. Bougnot, et al. in "Growth of $Ga_{1-x}Al_x$ Sb and $Ga_{1-x}In_xSb$ by Organometallic Chemical Vapor Deposition", and at page 400–407 by R. M. Biefield in "The Preparation of $InAs_{1-x}Sb_x$ Alloys and Strained-Layer Super-lattices by MOCVD."

In an article by James H. Comfort, et al. entitled "In-situ Arsenic Doping of Epitaxial Silicon at 800° C. by Plasma Enhanced Chemical Vapor Deposition" appearing in *Applied Physics Letter*, 51(19), 9 Nov. 1987, pages 1536–1538, a discussion is presented of the arsenic doping of epitaxial silicon films using chemical vapor deposition wherein arsine is the source of the arsenic doping.

In an article by Jacques S. Mercier entitled "Rapid Flow of Doped Glasses for VLSIC Fabrication" appearing in *Solid State Technology*, July 1987, pages 85–91, a report on doping of phosphosilicate glass and borophosphosilicate glass was given. The effects of flow of such glass on electronic devices is specifically identified.

In an article by R. M. Lum, et al. entitled "Investigation of Carbon Incorporation in GaAs using $^{13}$C-enriched trimethylarsenic and $^{13}CH_4$", appearing in *Journal of Electronic Materials*, Vol. 17, No. 2, (1988), pp. 101–104, it was reported that increased occurrences of carbon impurity contamination of chemical vapor depositions of gallium arsenide are achieved when the less toxic trimethylarsenic is used in place of arsine.

In another article by R. M. Lum, et al. entitled "Investigation of Triethylarsenic as a Replacement for Arsine in the Metal-organic Chemical Vapor Deposition of GaAs", appearing in *Applied Physics Letter*, Vol. 52, (18) May 2, 1988, the use of the named arsenic compound was discussed, but problems with carbon deposition were noted.

In an article by A. Tromsom Carli, et al. entitled "Metal Organic Vapour Phase Epitaxy of GaAs: Raman Studies of Complexes Formation", reported in *Revue Physical Applications*, Volume 20 (1985); pgs. 569–574, the use of trimethyl arsenic in place of arsine in a metal organic vapor phase epitaxy to produce gallium-arsenic was described. The article summarizes sources of contamination in epitaxial electronic layers, wherein such contamination includes carbon, silicon and zinc.

In U.S. Pat. No. 4,721,683, tertiary alkyl phosphine and arsine compounds are disclosed to have utility for semiconductor ion implantation.

In Chapter 5 from *VLSI Technology*, edited by Sze, pp 169–217, (1983), diffusion applications are described in detail. Diffusion sources of phosphorus are generally implanted, but can be vapor sourced from $P_2O_5$. Arsine diffusion sources are generally ion implanted. Diffusion was further described in B. Swaminathan, et al. "Diffusion of Arsenic In Polycrystalline Silicon", *Applied Physics Letter*, 40(a) May 1982, pp 795–798; and in T. Kook et al "Diffusion of Dopants in (111) Silicon During High Temperature Heat Treatment in Nitrogen", *Material Research Society Symposium Proc.*, Vol 36, (1985) pp 83–88.

Chemical beam epitaxy is a specialized form of epitaxial growth which has been shown to be amenable to organometallic source materials. Such demonstrations are found in W. T. Tsang, "Chemical Beam Epitaxy of InP and GaAs", *Applied Physics Letter*, vol. 45, No. 11, 1 Dec. 1984 pp 1234–1236; W. T. Tsang, "Chemical Beam Epitaxy of InGaAs", *Journal of Applied Physics*, 58(3), August 1985, pp. 1415–1418, and H. Kroemer, "MBE Growth of GaAs on Si. Problems and Progress", *Material Research Society Symposium Proceedings*, (67), (1986), pp 3–14.

Trimethylamine alane is disclosed as having utility in molecular beam epitaxy to produce AlGaAs in a publication, "Growth of High Quality AlGaAs by Metalorganic Molecular Beam Epitaxy Using Trimethylamine Alane", by C. R. Abernathy et. al. in *Applied Physics Letter*, Vol. 56 (26), pp. 2654–2656, Jun. 25, 1990.

Arsine and phosphine are used extensively in organometallic vapor phase epitaxy of Group III–V compound semiconductor materials. Typically in this technique, a metal alkyl organometallic compound such as trimethyl aluminum, trimethyl indium, and/or trimethyl gallium (or other alkyl sources such as the corresponding ethyl compounds) is combined with the hydride of arsenic or phosphorus at high temperature to form single crystal (epitaxial) AlGaAs, InGaAs, InP, or GaAs, or any other mixed compound semiconductor material. Arsine is also used extensively as an n-type dopant in the epitaxial growth of silicon electronic materials, or cracked and implanted, using ion implanters, into silicon device structures. Phosphorous is used in the production of BPSG (borophosphosilicate glass) and PSG (phosphosilicate glass) glass, and similarly arsine can be used for ASG (arsenosilicate glass), to enhance reflow properties of the glass. In all these cases, arsine and phosphine are the volatile carriers of arsenic and phosphorus to the appropriate material or process.

Arsine is known to be a highly toxic material, with a Threshold Limit Value (TLV) of 0.05 ppm and a toxic limit near 5 ppm. Phosphine is not quite as toxic as arsine, but is still highly hazardous with a TLV of 5 ppm. Both are high pressure compressed gases under normal use conditions, or are supplied as high pressure mixtures in hydrogen. One of the major costs in performing Organometallic Vapor Phase Epitaxy (OMVPE), are costs associated with the installation of safety systems, including high efficiency ventilation systems, elaborate detection and alarm systems, isolated gas storage facilities, emergency purge systems and elaborate gas scrubber systems. In some areas, local regulations have gone as far as to prohibit the storage or use of arsine within municipal boundaries, or have required such elaborate safety systems as to make usage costs prohibitive. In other cases, individual company or academic safety policies have been written which have the same effect as local legislation; resultant prohibitive costs. A number of research individuals have also voluntarily refused to use arsine, due to a personal assessment of unnecessary risk. Although users of phosphine have not yet had to install such elaborate safety systems as with arsine, standard practices for phosphine usage are moving in this direction.

In silicon devices, it is often desired to dope during epitaxial growth with an n-type dopant. Typically, arsine is used during the in-situ doping step. Because of similar safety considerations as those for the GaAs semiconductor industry, silicon device manufacturers have been forced to move away from in-situ arsenic doping to post-epitaxial arsenic ion implantation. Arsine is electrically ionized under high voltage conditions forming ions of As, As2, As3, etc., and implanted through an ion accelerator into the silicon surface. An alternative to arsine in the ion implantation step is elemental arsenic (or elemental phosphorus for phosphorus implantation). However, the preferred materials remain arsine and phosphine, due to process logistics.

Diffusion of Group VA elements into silicon is used to form bases, emitters, resistors, source and drain regions, and doping of polycrystalline silicon. The Group VA element can be introduced into the silicon from diffusion of a chemical source in a vapor form at high temperatures, diffusion from a doped-oxide source, or diffusion and annealing from an implanted layer.

Researchers in the electronics field have examined using possible substitutes for arsine and phosphine. However, some compromises had to be made especially in attempts to effectively grow compound semiconductor material. Experimental focus has been on the peralkyl and alkyl hydrides of the Group V elements, e.g., trimethyl arsenic, dimethyl arsine, diethyl arsine, t-butyl arsine, t-butyl phosphine, and di-n-butyl phos- phine, among others. Although the toxicities of these materials would be somewhat less than $AsH_3$ or $PH_3$, the hazard levels are seen to be much lower because they are not compressed gases. For instance, tert-butyl arsine (TBAs) has an LC50 of 70 ppm in rats via inhalation, corresponding to an OSHA TLV/TWA ceiling limit of 0.5 $mg/m^3$, or roughly 80 ppb. This toxicity limit is almost on par with arsine itself, which has a TLV/TWA of 50 ppb. Because the material is a liquid with a boiling point of 69° C., the hazard level is seen to be much lower.

Carbon incorporation into grown films of GaAs or other compound semiconductor materials is a serious problem with these substitutes. The reasons for incorporation of carbon into an epitaxial compound semiconductor layer are twofold. Metal Group V carbon bonding is fairly stable to thermal decomposition, therefore requiring fairly high growth temperatures. The strength of this metal-carbon bond, even at these high temperatures, allows a fairly high surface concentration of methyl radicals to build up, which can be incorporated during epitaxial growth. Additionally, the methyl radicals can form stable surface complexes with both Group III and Group VA surface elements. Methyl radicals can eliminate hydrogen easily at these process temperatures, as this bond is the weak bond in the system for the Group III arsenides and/or phosphides, and incorporate the carbon into the compound semiconductor crystal lattice. Carbon preferentially incorporates into the Group VA element lattice site. Additionally, methyl radicals are adsorbed and desorbed in the boundary layer, leading to further migration and incorporation of carbon. Lowering the system pressure during growth drives the adsorption/desorption equilibrium towards desorption, lowering the amount of incorporated carbon somewhat. Trimethyl arsine has been documented as giving fairly severely carbon doped GaAs epitaxial films. Tert-butyl arsine has been used in attempts to minimize carbon incorporation, due to the stability of the tert-butyl organic fragment produced during pyrolysis. The t-butyl fragment is too sterically hindered to fit into the GaAs crystal lattice, giving less severely doped films. Additionally, the strong carbon-carbon bonds must be broken to incorporate carbon from this fragment. However, it is standard practice in the MOCVD growth of InSb to use trimethyl antimony as the Sb source, with few problems related to intrinsic carbon incorporation.

In the area of phosphorus doping for BPSG (borophosphosilicate glass), there are some commercially acceptable alternatives to phosphine, such as phosphorus oxychloride, or trimethyl phosphite, known as POCl and TMP, respectively, in the electronics industry. However, there are no arsenic sources, which could substitute for arsine in ASG (arseno-silicate glass) production that have found industry favor or utility.

U.S. Pat. No. 4,904,616 discloses arsenic, antimony and phosphorus derivatives having fluorocarbon character, which lessen the drawbacks of using such atoms in electronic materials fabrication.

Amides of arsenic, antimony and phosphorus are discussed in the treatise, METAL AND METALLOID AMIDES by Lappert et al., Ellis Horwood Ltd., 1980, Chapters 6 and 7, pages 382–464, wherein syntheses and various compositions are set forth.

The above-identified prior art sets forth the state of reactive deposition of Group III and Group V compounds for production of epitaxial layers and various doping applications of pre-existing layers and glasses. The prior art recognizes the drawbacks in the use of arsenic, phosphorus antimony and other metal complexes as reactant sources which have difficult transportation and storage, problematic purity maintenance, acute toxicity concerns, as well as contribution to impurity formation in the end product which are derived from such reactant sources. These problems of the prior art have been overcome by the improved processes of the present invention set forth below.

BRIEF SUMMARY OF THE INVENTION

The present invention is a method for the reactive deposition of a Group VA metal to a substrate using a metalorganic as a metallic donor source reactant containing arsenic, phosphorus or antimony wherein the metallic donor source reactant is at least partially amino derivative-substituted, preferably fully amino derivative-substituted.

More specifically, the metallic donor source reactant is selected from the group consisting of compounds of the formula: $M(NR_2)_{3-x}H_x$, where R is one or more organic radicals wherein said organic radicals are selected from the group consisting of alkyl, cycloalkyl, aryl, alkenyl, arenyl or fluoroalkyl, and x is less than or equal to 2, and M=As, Sb or P.

In a preferred embodiment, the present invention is a method for the reactive deposition of a Group VA metal to a substrate, wherein the improvement comprises using a reactant selected from the group consisting of compounds of the formula: $M(NR_2)_{3-x}H_x$, where R is alkyl or fluoroalkyl, and x is less than or equal to 2, and M=As, Sb or P. Preferably the reactant is tris(dialkylamino) arsenic ($As(NR_2)_3$), tris(dialkylamino) antimony ($Sb(NR_2)_3$), or tris(dialkylamino) phosphorus ($P(NR_2)_3$).

More specifically, the present invention is a method of organometallic vapor phase epitaxial deposition of semi-conductor materials containing a Group VA metal using at least two reactants in which one of the reactants is a metalorganic used as a metallic donor source reactant containing arsenic, phosphorus or antimony wherein the metallic donor source reactant is at least partially amino derivative-substituted.

Specifically, in organometallic vapor phase epitaxy a metallic donor source reactant is selected from the group consisting of compounds of the formula: $M(NR_2)_{3-x}H_x$, where R is alkyl or fluoroalkyl, and x is less than or equal to 2, and M=As, Sb or P. Preferably the reactant is tris(dialkylamino) arsenic ($As(NR_2)_3$), tris(dialkylamino) antimony ($Sb(NR_2)_3$), or tris(dialkylamino) phosphorus ($P(NR_{2(3)}$).

A preferred embodiment of that aspect of the present invention is a method of organometallic vapor phase epitaxial deposition of semiconductor materials using at least two reactants, the improvement comprising using one of the reactants selected from the group consisting of compounds having a formula: $M(NR_2)_{3-x}H_x$, where R is alkyl or fluoroalkyl, and x is less than or equal to 2, and M=As, Sb or P. Preferably the reactant is tris(dialkylamino) arsenic ($As(NR_2)_3$), tris(dialkylamino) antimony ($Sb(NR_2)_3$), or tris(dialkylamino) phosphorus ($P(NR_2)_3$).

Preferably the organometallic vapor phase epitaxial deposition is performed with a second reactant such as trialkyl gallium, trialkyl indium or trialkyl aluminum and more specifically trimethyl gallium, trimethyl indium, trimethyl aluminum or mixtures thereof. Also useful are triethyl gallium, aluminum and indium. Also useful are the Group III hydride adducts, such as trimethylamine alane, trimethylamine gallane, tetramethyl(ethylenediamine) alane, etc., and cyclic adducts, such as dimethyl(3-dimethylaminopropyl) gallium, 1-(3-dimethylaminopropyl)-1-galla-cyclohexane, etc.

Another specific application of the present invention is a method of doping silicon dioxide-based glass or borosilicate-based glass with a Group VA metal using a metalorganic as a metallic donor source dopant containing arsenic, phosphorus or antimony wherein the metallic dopant is at least partially amino derivative-substituted.

More specifically, the metallic donor source dopant is selected from the group consisting of compounds of the formula $M(NR_2)_{3-x}H_x$, where R is alkyl or fluoroalkyl, and x is less than or equal to 2, and M=As, Sb or P. Preferably the reactant is tris(dialkylamino) arsenic ($As(NR_2)_3$), tris(dialkylamino) antimony ($Sb(NR_2)_3$), or tris(dialkylamino) phosphorus ($P(NR_2)_3$).

Another specific aspect of the present invention is a method of n-type doping of silicon epitaxial or polycrystalline material with a Group VA metal using a metallic donor source dopant containing arsenic, phosphorus, or antimony, wherein the metallic dopant is at least partially amino derivative-substituted.

More specifically the metallic donor source dopant is selected from the group consisting of compounds of the formula $M(NR_2)_{3-x}H_x$, where R is alkyl or fluoroalkyl, and x is less than or equal to 2, and M=As, Sb or P. Preferably the dopant is tris(dialkylamino) arsenic ($As(NR_2)_3$), tris(dialkylamino) antimony ($Sb(NR_2)_3$), or tris(dialkylamino) phosphorus ($P(NR_2)_3$).

A specific technique of the present invention is a method of ion implantation of a Group VA metal in a semi-conductor substrate using a metalorganic as a metallic donor ion source containing arsenic, phosphorus or antimony wherein the metallic donor ion source is at least partially amino derivative-substituted.

More specifically, the metallic donor ion source is selected from the group consisting of compounds of the formula $M(NR_2)_{3-x}H_x$, where R is alkyl or fluoroalkyl, and x is less than or equal to 2, and M=As, Sb or P. Preferably the source is tris(dialkylamino) arsenic ($As(NR_2)_3$), tris(dialkylamino) antimony ($Sb(NR_2)_3$), or tris(dialkylamino) phosphorus ($P(NR_2)_3$).

A further aspect of the present invention is a method of diffusing a Group VA metal into an electronic material substrate from a vapor metallic donor source to react the diffused metal to the substrate, wherein the improvement is the use of a metalorganic as a metallic donor source which is at least partially amino derivative-substituted.

Specifically the diffusion source is selected from the group consisting of compounds of the formula: $M(NR_2)_{3-x}H_x$, where R is alkyl or fluoroalkyl, and x is less than or equal to 2, and M=As, Sb or P. Preferably the reactant is tris(dialkylamino) arsenic ($As(NR_2)_3$), tris(dialkylamino) antimony ($Sb(NR_2)_3$), or tris(dialkylamino) phosphorus ($P(NR_2)_3$).

A final aspect of the present invention is a method of chemical beam epitaxy for deposition and reaction of a Group VA metal with an electronic material substrate using a Group VA metallic donor source wherein the improvement is the use of a metalorganic as a Group VA metallic donor source which is at least partially amino derivative-substituted.

Specifically the source is selected from the group consisting of compounds of the formula $M(NR_2)_{3-x}H_x$, where R is alkyl or fluoroalkyl, and x is less than or equal to 2, and M=As, Sb or P. Preferably the source is tris(dialkylamino) arsenic ($As(NR_2)_3$), tris(dialkylamino) antimony ($Sb(NR_2)_3$), or tris(dialkylamino) phosphorus ($P(NR_2)_3$).

DETAILED DESCRIPTION OF THE INVENTION

Metalorganic amine metallic donor sources; compounds of the formula $M(NR_2)_{3-x}H_x$, where R is one or more organic radicals wherein said organic radicals are selected from the group consisting of alkyl, cycloalkyl, aryl, alkenyl, arenyl or fluoroalkyl, and x is less than or equal to 2, and M=As, Sb or P, solve the problems of hazard level, source of contamination, high vapor pressure, and their effect on the physical properties of the corresponding compounds. Increasing the number of amino derivative-substitutions should result in systematic trends; decreasing toxicity with each additional substitution, and decreasing vapor pressure with each additional substitution. The problem of intrinsic carbon incorporation decreases with certain structures due to steric hindrance, fragment chemical activity, and fragment stability.

Previous solutions to finding alternatives to toxic arsine, phosphine and antimony compounds have focused on the alkyl metal organometallics. The distinguishing difference with the present invention is the use of metalorganic amine metallic donor sources to further lower toxicity and use hazard levels, as well as lowering of carbon contamination of the resulting end product by the elimination of direct metal carbon linkages. The metalorganic amine metallic donor sources of the present invention are also an advantage due to their vapor pressures, steric hindrance, and fragment stability.

The present invention specifically addresses the uniquely beneficial properties of the metallic donor source compounds $M(NR_2)_{3-x}H_x$, where R is organic or fluoroorganic, and x is less than or equal to 2, and M=As, Sb or P. The organic radical can be at least partially fluorinated. Specifically, the organic radicals are selected from the group consisting of alkyl, cycloalkyl, aryl, alkenyl or arenyl, or at least partially fluorinated derivatives thereof. The present invention is directed to the application of these materials to processes requiring reactive deposition of the corresponding element. These applications include a number of different reactive deposition processes; in organometallic vapor phase epitaxy (OMVPE) or chemical beam epitaxy of compound semiconductor materials such as GaAs, GaInAs, InP, InSb, etc., in doping of SiO2 or borosilicate based glasses to enhance the reflow properties of the glass, for in-situ, n-type doping of silicon epitaxial material, or as a safe, less toxic source of arsenic or phosphorus for ion implantation or diffusion. Reactive deposition differs from simple elemental deposition in that the former results in a reacted or bonded metal rather than a mere surface or superficial metal layer achieved as in the latter simple elemental deposition.

Chemical vapor deposition (CVD) is an essential process in the fabrication of integrated circuits. The deposited layers fulfill many functions, and range, in chemical composition, from metals and alloys through to semiconductors and insulators. These materials provide conductive links within the device architecture, maintain electrical insulation between layers, or act as protective coatings during etching or subsequent processing. There is a close relationship between device physics, circuit design, the desired electrical properties of the layers and the chemistry underlying the deposition process.

In essence, CVD is a remarkably simple yet versatile technique in which the decomposition of a gaseous precursor, either homogeneously or heterogeneously, produces a solid thin film. Indeed, several reaction types have been utilized in semiconductor device fabrication and other coating applications. These include thermal decomposition, oxidation and reduction, hydrolysis and ammoniolysis, polymerization, plasma processes, photochemical processes and processes which depend on physical mass transport. The microelectronics industry relies predominantly on thermal decomposition at high temperatures for the deposition of epitaxial silicon, polycrystalline and amorphous silicon, silicon dioxide and stoichiometric silicon nitride. The requirement for lower-temperature processing conditions has resulted in the development of plasma-enhanced CVD and photolytic CVD as a means of depositing a variety of electronic materials using non-thermal excitation methods.

Historically, high-purity metals were prepared by CVD involving the corresponding metal halides, the technique stemming from the work of van Arkel and de Boer. The technology was subsequently applied to silicon by Holbing. Refinements of this process resulted in the so-called Siemens process in which uptrapure polycrystalline silicon is deposited on to thin silicon rods at 1000°-1200° C. from the reduction of $SiHCl_3$ in an $H_2$ diluent. The manufacture of polycrystalline silicon ingots represents the largest single application of CVD; subsequent crystal growth by the Czochralski or the Float Zone method produces the ubiquitous single-crystal silicon wafer.

Current CVD techniques for film growth have developed from processes carried out at atmospheric pressure using thermal heating for reactant dissociation. A number of variations have emerged with the obligatory, although non-standarized, acronyms. These are listed in Table 1.

TABLE 1

| Chemical Vapour Deposition (CVD) Techniques | | |
| --- | --- | --- |
| Process | Acronym | Energy Source |
| Atmospheric pressure CVD | APCVD | Thermal |
| Low-pressure CVD | LPCVD | Thermal |
| Homogeneous CVD | HOMOCVD | Thermal |
| Metallo-organic CVD | MOCVD | Thermal |
| Plasma-enhanced CVD | PECVD | RF |
| Photolytic CVD | UVCVD | Photons |
| Laser CVD | LCVD | Photons |
| Vacuum chemical epitaxy | VCE | Thermal |
| Metalorganic molecular beam epitaxy | MOMBE | Thermal |
| Chemical beam epitaxy | CBE | Thermal |
| Atomic layer epitaxy | ALE | Thermal |

The technology of these CVD processes encompasses a wide range of conditions of temperature, pressure and flow rates, each parameter being carefully controlled to produce uniform, coherent and defect-free films exhibiting reproducible characteristics. Substrate temperatures can be as low as 100° C. (PECVD) and may extend to above 1000° C. (APCVD). Process pressures range from atmospheric to c.0.05 Torr in some LPCVD applications. Traditional thermal dissociation techniques have been supplemented by the use of RF or photolytic excitation.

While silicon processing is relatively well understood and the inherent advantages of silicon chemistry ensure its dominant position for some time, compound semiconductors are emerging as potential rivals for certain applications. The characteristics of Group III–V semiconductors, notably GaAs, have been known for some time. With the advent of metal-organic chemical vapour deposition, MOCVD, the importance of this technique to the growth of compound semiconductors has grown considerably.

The present invention's improvement in reactive deposition of the metal-organic vapor phase type deals with a technique for the growth of films on single-crystal substrate wafers which are treated chemically to act as a crystal 'template' for the continued growth of the crystal. Thus, to a first approximation, there is no change in the lattice of the semiconductor in moving through the interface. Other parameters, e.g. dopant concentration or type, may change at the interface producing heterostructures and heterojunctions, but the crystal structure is continuous. For instance, the growth of AlGaAs on GaAs is a heterojunction where the specific lattice sites differ, but the layers remain single crystalline. GaAs on silicon would be another, more extreme example of lattice mismatched heterostructures. This effect is called epitaxy, from the Greek epi (upon) and taxis (ordered).

This aspect of semiconductor growth leads to the first necessity of any growth technique: it must be capable of growing good-quality single-crystal material, with an interface epitaxially congruent with the substrate. Some mismatch can be tolerated, imparting strain into the grown single crystal material, i.e. GaAs on Si. For an elemental semiconductor with a diamond-like lattice, for example silicon, this involves growing the crystal without atoms missing from lattice sites (vacancies), or atoms in between their correct location in the lattice (interstitials), or with two planes of atoms not meeting correctly (dislocations). Compound semiconductors like gallium arsenide (GaAs) have a zince blend structure, i.e. a diamond lattice with every alternate atom either gallium or arsenic. Growth of compound semiconductors may thus pose the additional problem of the crystal growing with gallium on the arsenic sub-lattice and vice-versa (antisite defects). With the addition of a third element to make a ternary alloy like aluminum gallium arsenide (AlGaAs) there are further complications to growing good-quality crystals.

The nomenclature of the film-growth technique is sometimes confused. The term "metal-organic chemical vapour deposition" (MOCVD) covers both the growth of epitaxial material and the growth of polycrystalline or metallic layers. On the other hand, "metal-organic vapour phase epitaxy" (MOVPE) is specific to the growth of single-crystal material.

MOVPE is part of a wider family of VPE (vapour-phase epitaxy) growth techniques which make use of the reactions occurring between the vapours of volatile chemical compounds when they are heated together. These reactions produce chemically active species that interact, either in the vapour phase or on a solid surface of the substrate to produce a corresponding epitaxial layer.

MOVPE specifically utilizes vapours from metal-organic compounds. (The term 'metal-organic' tends to be used to include organometallic compounds like metal alkyls, for instance trimethylgallium, and, more rarely, the metal alkoxides which have no metal-carbon bond and are therefore not strictly organometallic. Each alkyl is usually referred to as a four-letter acronym which includes the chemical symbol of the metal. Typical starting materials used to grow GaAs are trimethylgallium (TMGa) and arsine (AsH$_3$). These two compounds can react at 700° C. under hydrogen to produce epitaxial GaAs.

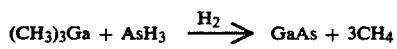

$$(CH_3)_3Ga + AsH_3 \xrightarrow{H_2} GaAs + 3CH_4$$

This reaction was first reported in 1968 and can be used as an illustration of a simple MOVPE reactor. Trimethylgallium is liquid at STP, and is held in a stainless steel bubbler where the bubbles of hydrogen become saturated with TMGa vapour; this vapour is then transported to the reaction cell. Gaseous AsH$_3$ is supplied either neat or diluted with hydrogen in a steel cylinder. The pressure is reduced to the reactor pressure (usually atmospheric but sometimes less than atmospheric pressure to, for example, 100 Torr).

The two gas streams are intimately mixed and passed over a heated graphite block called a susceptor, which holds a GaAs single-crystal wafer.

Energy for heating the susceptor is usually provided by a high-power radiofrequency generator operating at about 450 kHz, but can also be supplied by resistance heating or infra-red lamps. TMGa and AsH$_3$ are heated in the reaction zone in the bounding layer of the susceptor and react to deposit GaAs. The growth of indium phosphide is similar, save that the carrier gas is sometimes helium or nitrogen or a combination of these with hydrogen.

Probably the most important aspect of material preparation in the semiconductor industry is obtaining source material of known (usually high) purity. In traditional areas of chemistry, materials or compounds of sufficient purity are readily obtainable by standard methods, but semiconductors are difficult to obtain with an acceptable purity. Dopants may be added in minute, controlled, amounts in order to impart desired electrical properties to the semiconductor; but this needs pure starting materials to be successful.

In real semiconductor materials, total purity is not possible; a crystal of 'pure' GaAs contains about $10^{23}$ atoms cm$^{-3}$ of which approximately $10^{13}$ would be impurities. A useful growth technique should be able to achieve this level of purity (less than 1 part per billion), which places stringent constraints on the purity of the starting materials.

Group VI elements in GaAs (e.g. S, Se, Te) replace As in the lattice, release electrons in the conduction band, and are n-type. Group II elements (Be, Mg, Zn, Cd) replace Ga, accept electrons, and are p-type. Group IV elements can behave amphoterically, becoming either n-type or p-type dopants, but generally carbon occupies arsenic sites and is a p-type dopant, and silicon occupies gallium sites and is an n-type dopant. When such elements are unavoidably present, they are known as n-type and p-type impurities; if added deliberately, they are dopants. Oxygen and transition metals behave as deep centres able to trap either electrons or holes.

After crystal quality and purity, the final important parameter in any growth technique is control of growth rate of the crystal in order to produce layers of uniform and reproducible thickness and to produce interfaces of suitable abruptness for the device in question. In the case of vapour-phase epitaxy this implies close control of the concentration of the reactants in the vapour phase.

MOVPE is used to grow compound semiconductors. These are more complicated to grow than elemental semiconductors (like silicon or germanium) but they have special properties that make them an increasingly important aspect of industrial semiconductor growth. The group of binary Group III–V semiconductors includes GaAs, InP and other combinations of Group III and V elements, e.g. AlSb, InSb, AlP, GaSb, AlAs and GaP. It is also possible to have different Group III elements on the same sub-lattice, e.g. aluminum gallium arsenide (AlGaAs), or to combine different Group V elements, e.g. gallium arsenide antimonide (GaAsSb), thus growing a ternary alloy. For some applications it is necessary to combine four elements into a quaternary semiconductor, e.g. indium gallium arsenide phosphide (InGaAsP). For ternary and quaternary Group III–V materials, the ability to vary the physical properties with alloy compositions is one of the factors which render these systems potentially useful in solid state electronics.

Incorporating dopant atoms into silicon and silicon-based electronic devices involves the same considerations as the Group III–V, MOCVD growth process requires, for example, mass transport and chemical reactions.

Typically, hydrides of the impurity atoms are used as the source of dopant. One might expect that these compounds would decompose spontaneously, but they do not. Thermodynamic calculations indicate that the hydrides are relatively stable because of the large volume of hydrogen present in the reaction. Typical of the dopant chemistry is the reaction for arsine, which shows arsine being absorbed on the surface, decomposing, and being incorporated into the growing layer. Interactions also take place between the doping process and the growth process. First, in the case of boron and arsenic the formation of chlorides of these species is a competing reaction. Second, the growth rate of the film influences the amount of dopant incorporated in the silicon. At low growth rates an equilibrium is established between the solid and the gas phase, which is not achieved at higher growth rates.

Ion implantation is a well-known and widely used process for injecting atoms into a solid material to selected depths and concentrations in selected areas. Ion implant accelerators are similar to isotope separators but typically have an added acceleration stage and field controls for precisely locating the beam of ions and controlling the energy and flux of the beam of ions to cause the desired penetration and concentration. Atoms of the selected chemical element to be ionized are ionized by collisions with electrons in an electrical discharge in a gas at low pressure and pass through an orifice into a high-vacuum region where they are accelerated by an electric field to an intermediate energy, typically from 10 to 30 KeV, where they are analyzed by a magnetic field based upon the e/m ratio, i.e. the ratio of electronic charge over mass. The selected ion beam passes through an analyzer slit, and the ions are accelerated to the desired energy, and the beam passes through a refocussing field, typically a quadrupole lens, is deflected by a scanner system, and collimated by a defined aperture and allowed to strike the target. When the ions penetrate the target lattice, they lose energy through collisions with lattice atoms and come to rest as part of the target. There are, of course, a large number of variations between specific ion implant systems but the foregoing principles apply generally to ion implant processes. The ion implant technique is described, inter alia, in U.S. Pat. Nos. 2,750,541, 2,787,564 and 2,842,466, which are incorporated herein. The ion implant method is also described in many texts, encyclopedias and scientific journals; see, e.g. ENCYCLOPEDIA OF SEMICONDUCTOR TECHNOLOGY, "Ion Implantation" pp. 397–410, John Wiley & Sons (1984) and the numerous references cited therein; see also, Kirk Othmer CONCISE ENCYCLOPEDIA OF CHEMICAL TECHNOLOGY, "Ion Implantation", p. 666 et seq., John Wiley & Sons (1985); and ION IMPLANTATION, J. K. Hirvonen, ed., Academic Press, Inc. (1980). Since the equipment and methods of ion implantation are so thoroughly described and widely used in the semiconductor industry, those skilled in the art are familiar with these methods and devices and may refer to any of the many excellent journal, text and patent descriptions for details. Manufacturer's manuals, provided with specific items of equipment are the best source for details as to a given piece of equipment.

Chemical beam epitaxy is another fabrication technique which can benefit from the present invention. Unlike MOCVD, in which the chemicals reach the substrate surface by diffusing through a stagnant carrier gas boundary layer above the substrate, the chemicals in chemical beam epitaxy are admitted into a high vacuum growth chamber and impinge directly line of sight onto a heated substrate surface in the form of a molecular beam. In chemical beam epitaxy, the desired reactants containing chemicals with metals such as As, P or Sb, as well as Ga, Al and In, are separately disassociated by heat either in the injector or at the substrates, and their respective vapor pressures drive them through a targeting device in the evacuated reaction chamber to the selected target for appropriate reaction.

The final specific technique to mention here which is benefited by the present invention is diffusion. In diffusion the diffusion source is typically heat decomposed over the substrate to be treated while the substrate itself is also heated. The source material provides elements such as arsenic, phosphorus or antimony which may have also been previously doped into the substrate. The heating process allows the source elements to diffuse into and diffuse by migration within the substrate to the appropriate lattice location. The substrate can be any electronic material such as glass, silicon, polysilicon, single crystal silicon or various specific electronic structures in such substrates.

Having described generally the applicable processes, it is appropriate to address the advantages of the compounds of the present invention used in such processes.

Metalorganic amine, metallic donor sources have quite different properties than the corresponding alkyl-substituted compounds. For instance, arsenic is bound directly to nitrogen, with no direct arsenic to carbon bonds, thus allowing the amino compound to decompose at a lower temperature and avoiding the potential for carbon being incorporated into the electronic material being made or treated, such as an epitaxial layer. Most of the Group VA metal metalorganic amine compounds would be expected to behave similarly.

An added potential benefit to the fluoroorganic substituted amino compounds is that the fluoroorganic amine fragments are stable species, under normal conditions, due to a higher C—F bond energy compared to C—H. A fluoroalkyl amino group on a Group V element should lower the M—N (M=As, P, Sb) bond energy compared to the M—N bond in a perhydroalkyl amino compound especially for alkyl fragments of ethyl or higher. This lowering of the metallic donor source's bond strength would lead to clean decomposition and few secondary gas phase or surface reactions, and possibly a lowered decomposition temperature, as compared to the corresponding perhydroalkyl-substituted amino metallic donor sources.

Fluoroalkyl radicals tend to be fairly stable, so there would be little driving force to contaminate carbon into any epitaxial layer by inadvertent cleavage of fluorine, even under typical MOCVD process temperatures (550°–750° C.). Additionally, regardless of growth temperature, the fluorocarbon fragments should not fit into the crystal lattice of any compound semiconductor material due to the added steric bulk imparted by the comparatively more bulky fluorines. Fluoroalkyl amino Group V hydrides can also be used in this scenario, although their toxicity characteristics would be nearer the perhydrides (arsine).

Standard synthetic procedures normally used to make metalorganic amine metallic donor source compounds include methods outlined in "METAL AND METALLOID AMIDES, SYNTHESIS, STRUCTURES, AND PHYSICAL AND CHEMICAL PROPERTIES", M. F. Lappert, A. R. Sanger, P. P. Power, R. C. Srivastava; Ellis-Horwood Publishers, 1980 and are exemplified by the treatment of AsCl$_3$ with Grignard reagents and lithium amides or a lengthy four step procedure involving As$_2$O$_3$ as a starting material as follows:

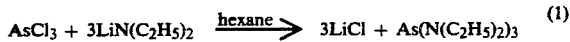
(1)

(2)

Reaction (1) may be generalized for any of the lithium amides. The second reaction (2) is limited to amines which contain a strongly acidic hydrogen atom.

The preparation of metalorganic amine Group V metallic donor source, compounds could be generalized using the above methods to make all of the listed categories of products.

EXAMPLE 1

Ten grams of moisture-free AsCl$_3$ and a stir bar are charged to a three-necked flask. 13.3 g (10% excess) of dry diethylamine are added dropwise via dropping funnel under a nitrogen atmosphere. The mixture is stirred for 4 hours. Excess diethylamine is removed and the product is distilled under vacuum in the presense of LiN(C$_2$H$_5$)$_2$. Liquid As(N(C$_2$H$_5$)$_2$)$_3$ is obtained in 60% yield.

The growth of GaAs, InP, or other Group V metal containing compound semiconductors by MOCVD can be accomplished using the general methods described here:

EXAMPLE 2

The metal organic (MO) sources are held at a constant temperature, anywhere from $-15°$ C. to $+50°$ C., depending upon the specific source used, in order to control reactant vapor pressure. Purified hydrogen is then bubbled through the MO, carrying the reactant either to a mixing manifold just before the reactor system, or injected independently into the reactor. Hydrogen is also generally used as the balance gas in the reactor, making up the majority of the partial pressure within the reactor. This hydrogen flow through the reactor can be anywhere from 2 liter/minute to 50 liters/minute, depending on the size of the reactor, system pressure, and upon flow dynamics in the system (laminar vs. turbulent flow). The growth of GaAs and AlGaAs takes place upon GaAs wafers, and InP and InSb growth is done on InP wafers. Other alloys are grown on wafers having lattice match with epitaxial layer. The wafers are held on a heated susceptor where the reaction takes place. Typical susceptor temperatures range from 475° C. to 750° C., depending on the alloy which is grown, InSb being grown at the coolest temperatures and AlGaAs generally grown at the highest temperatures.

EXAMPLE 3

For the growth of AlGaAs using, for example, tris-dimethylamino arsine (TDMAAs), trimethyl gallium (TMGa), and trimethylamine alane (TMAAl) in a low pressure reactor, bubbler temperatures of 40° C., $-25°$ C., and 15° C., respectively, might be used to effect the appropriate partial pressures of the metalorganics into the reactor. Susceptor temperatures would be held between 600° and 700° C., with a flow of 150 sccm, 15 sccm, and 100 sccm flow of hydrogen through each bubbler, respectively. Total reactor pressure would be approximately 10 torr to 100 torr, with a total hydrogen flow through the reactor approximately 2 standard liters/minute. Growth rates under these conditions would be near 1.5–2.5 microns per hour.

EXAMPLE 4

For the growth of InP, trimethyl indium (TMIn) and tris(dimethylamino) phosphine (TDMAP) could be used, with bubbler temperatures of 25° C. and 35° C., respectively. Hydrogen flow through these bubblers could be varied from 50 sccm to 250 sccm, depending upon desired Group III/V ratio. Susceptor temperatures would be held between 600° C. and 650° C., with total flow through the reactor of 2 standard liters/minute at 100 torr. Growth rates would be near 2 microns/hour under these conditions.

EXAMPLE 5

For the growth of InSb, TMIn and tris(dimethylamino) antimony (or stibine) could be used in bubblers held at 10° C. and 30° C., respectively. Hydrogen flow through the bubblers could be varied from 50 sccm to 250 sccm, depending upon the desired Group III/V ratio desired. Growth temperatures would be from 475° C. to 600° C., at a total reactor pressure of approximately 100 torr. Total hydrogen flow rates would be held near 2 slm.

EXAMPLE 6

For Chemical Beam Epitaxy, otherwise known as Metal Organic Molecular Beam Epitaxy (MOMBE), similar conditions would be used as those in MOCVD, except for total hydrogen flow due to the differences in total reactor pressure. AlGaAs, InP, InSb, InGaAs, and other compound semiconductor alloys can be grown in standard MOMBE reactors. The reactants would generally be transported into the Molecular Beam injector by a hydrogen carrier gas. Growth temperatures tend to be somewhat lower as compared to MOCVD conditions. In MOMBE, only the susceptor is heated, and due to the total system high vacuum, the thermal gradient is almost non-existant. Reagent bubbler temperatures would be held between $-30°$ C. and 45° C., depending upon desired V/III ratios, and upon the desired total reagent flux into the high vacuum system. Growth rates for MOMBE systems tend to be similar to that of Low Pressure MOCVD; 0.5 microns/hr to 2.0 microns/hr. Precracking of the reagents should not be required, but is an option, depending upon the users specific process.

A typical exemplary group of Group VA metalorganic amine metallic donor sources useful in the present invention, but in no way considered a limitation on the scope of compounds, comprises related compounds substituting phosphorus or antimony for the arsenic.

The major advantages which are afforded by the present invention are:

Fast Reaction Kinetics and Clean Reaction Products; Compounds such as triaminomethyl arsine decomposes cleanly and completely to metallic arsenic at lower temperatures than arsine. For instance, arsine pyrolyzes above ca. 700° C. The decomposition temperature of alkyl arsenicals is lower than that of arsine, but is still usually above ca. 500° C. In the case of tertiarybutyl arsine, initial decomposition begins at ca 350° C. The reaction mechanism produces AsH3 in-situ, however, which generally decomposes homogeneously above 700° C. The metalorganic amine metallic donor sources generally should decompose at even lower temperatures than the corresponding alkyls, due to the effects of nitrogen on the internal stabilities of the metal derivative bonds, and are possibly catalyzed by the presence of Group III metal alkyls, Group III hydrides (such as trimethylamine alane), or hydrogen.

Lower Toxicity; the fluorinated organic and organic derivatives of amino-substituted Group V metallic donor source compounds should have up to two orders of magnitude lower toxicity than the corresponding hydrides. This compares to arsine, which has a TLV/TWA of 0.05 ppm.

The major applications where metalorganic amine Group V compounds can be used to advantage are:

The MOCVD growth of GaAs, AlGaAs, InGaAsP, InP, InSb, and related compound semiconductor materials, as highly volatile, low toxicity source of arsenic, phosphorus, and/or antimony. For example, the growth of GaAs using trimethyl gallium and arsine requires growth temperatures between 600° and 700° C. Process temperatures below ca. 600° result in GaAs films of poor morphology, probably due to poor reaction kinetics of the arsine and subsequent poor removal of surface alkyls. An excess of arsine is required for growth, with ratios of AsH3 to Group III metal alkyl usually greater than 20 and often greater than 50. There is documentation that good morphology GaAs can be grown at 550° C. using diethyl arsine at a III/V ratio of 1, which is most likely due to the lower decomposition temperature of the arsenic source (the toxicity of DEAS should be similar to the toxicity of TBAS, with roughly a LC50=100 ppm and TLV=0.1 ppm).

The present invention has been set forth with descriptions of several preferred embodiments, however the scope of the invention should be ascertained from the claims which follow.

We claim:

1. In a method for the reactive deposition of a Group VA metal to a substrate using a metalorganic as a metallic donor reactant containing arsenic, phosphorus or antimony, the improvement wherein said metallic donor reactant is selected from the group consisting of compounds of the formula: $M(NR_2)_{3-x}H_x$, where R is one or more organic or fluoroorganic radicals, and x is less than or equal to 2, and M=As, Sb or P.

2. The method of claim 1 wherein said organic radicals are selected from the group consisting of alkyl, cycloalkyl, aryl, alkenyl or arenyl.

3. The method of claim 1 wherein said metallic donor reactant is tris(dialkylamino) arsenic.

4. The method of claim 1 wherein said metallic donor reactant is tris(dialkylamino) phosphorus.

5. The method of claim 1 wherein said metallic donor reactant is tris(dialkylamino) antimony.

6. In a method of metallic donor vapor phase epitaxial deposition of semiconductor materials containing a Group VA metal using at least two reactants in which one of the reactants is a metalorganic used as a metallic donor reactant containing arsenic, phosphorus or antimony, the improvement wherein said metallic donor reactant is selected from the group consisting of compounds of the formula: $M(NR_2)_{3-x}H_x$, where R is one or more organic or fluoroorganic radicals and when only one R is an organic or fluoroorganic radical than the other R is hydrogen, and x is less than or equal to 2, and M=As, Sb or P.

7. The method of claim 6 wherein said organic radicals are selected from the group consisting of alkyl, cycloalkyl, aryl, alkenyl or arenyl.

8. The method of claim 6 wherein said metallic donor reactant is tris(dialkylamino) arsenic.

9. The method of claim 6 wherein said metallic donor reactant is tris(dialkylamino) phosphorus.

10. The method of claim 6 wherein said metallic donor reactant is tris(dialkylamino) antimony.

11. The method of claim 6 wherein a second reactant is selected from the group consisting of: trialkyl gallium, trialkyl indium, trialkyl aluminum and mixtures thereof.

12. The method of claim 11 wherein the second reactant is selected from the group consisting of: trimethyl gallium, trimethyl indium, trimethyl aluminum and mixtures thereof.

13. The method of claim 6 wherein the resulting epitaxial semiconductor material is selected from the group consisting of: AlGaAs, InGaAs, InP, GaAs, InSb, InGaAsP, GaAsP, InAsP, InGaAlP, or AlGaP.

14. The method of claim 1 of said reactive deposition, comprising: doping silicon dioxide-based glass or borosilicate-based glass with a Group VA metal using a metalorganic as a metallic donor dopant source containing arsenic, phosphorus or antimony as said metallic donor reactant.

15. The method of claim 14 wherein said organic radicals are selected from the group consisting of alkyl, cycloalkyl, aryl, alkenyl or arenyl.

16. The method of claim 14 wherein said metallic donor dopant source is tris(dialkylamino) arsenic.

17. The method of claim 14 wherein said metallic donor dopant source is tris(dialkylamino) phosphorus.

18. The method of claim 14 wherein said metallic donor dopant source is tris(dialkylamino) antimony.

19. The method of claim 1 of said reactive deposition, comprising; n-type doping of silicon epitaxial or polycrystalline material with a Group VA metal using a metalorganic as a metallic donor dopant source containing arsenic, phosphorus or antimony as said metallic donor reactant.

20. The method of claim 19 wherein said organic radicals are selected from the group consisting of alkyl, cycloalkyl, aryl, alkenyl or arenyl.

21. The method of claim 19 wherein said metallic donor dopant source is tris(dialkylamino) arsenic.

22. The method of claim 19 wherein said metallic donor dopant source is tris(dialkylamino) phosphorus.

23. The method of claim 19 wherein said metallic donor dopant source is tris(dialkylamino) antimony.

24. The method of claim 1 of said reactive deposition, comprising; ion implantation of a Group VA metal in a semiconductor substrate using a metalorganic as a metallic donor ion source containing arsenic, phosphorus or antimony as said metallic donor reactant.

25. The method of claim 24 wherein said organic radicals are selected from the group consisting of alkyl, cycloalkyl, aryl, alkenyl or arenyl.

26. The method of claim 24 wherein said metallic donor ion source is tris(dialkylamino) arsenic.

27. The method of claim 24 wherein said metallic donor ion source is tris(dialkylamino) phosphorus.

28. The method of claim 24 wherein said metallic donor ion source is tris(dialkylamino) antimony.

29. The method of claim 1 of said reactive deposition, comprising; diffusing a Group VA metal into an electronic material substrate from a vapor metallic donor source containing arsenic, phosphorus or antimony as said metallic donor reactant to react the diffused metal to the substrate.

30. The method of claim 29 wherein said organic radicals are selected from the group consisting of alkyl, cycloalkyl, aryl, alkenyl or arenyl.

31. The method of claim 29 wherein said metallic donor source is tris(dialkylamino) arsenic.

32. The method of claim 29 wherein said metallic donor source is tris(dialkylamino) phosphorus.

33. The method of claim 29 wherein said metallic donor source is tris(dialkylamino) antimony.

34. In a method of chemical beam epitaxy or metalorganic molecular beam epitaxy for deposition and reaction of a Group VA metal with at least one other reactant with an electronic material substrate where one of the reactants is a Group VA metallic donor source, the improvement comprising the use of a Group VA metallic donor source which is selected from the group consisting of compounds of the formula: $M(NR_2)_{3-x}H_x$, where R is one or more organic or fluoroorganic radicals, and x is less than or equal to 2, and M=As, Sb or P.

35. The method of claim 34 wherein said organic radicals are selected from the group consisting of alkyl, cycloalkyl, aryl, alkenyl or arenyl.

36. The method of claim 34 wherein said metallic donor source is tris(dialkylamino) arsenic.

37. The method of claim 34 wherein said metallic donor source is tris(dialkylamino) phosphorus.

38. The method of claim 34 wherein said metallic donor source is tris(dialkylamino) antimony.

39. The method of claim 34 wherein the other reactant is selected from the group consisting of: trialkyl or hydride gallium, trialkyl or hydride aluminium, trialkyl or hydride indium and mixtures thereof.

40. The method of claim 34 wherein the other reactant is selected from the group consisting of triethyl gallium, tetramethylethylenediamine gallane, triethyl aluminum, tetramethylethylenediamine alane, trimethylamine alane, trimethyl indium, dimethyl aluminum hydride and mixtures thereof.

41. The method of claim 34 wherein the other reactant is triethyl gallium.

42. The method of claim 34 wherein the other reactant is tetramethylethylenediamine gallane.

43. The method of claim 34 wherein the other reactant is triethyl aluminum.

44. The method of claim 34 wherein the other reactant is tetramethylethylenediamine alane.

45. The method of claim 34 wherein the other reactant is trimethylamine alane.

46. The method of claim 34 wherein the other reactant is trimethyl indium.

47. The method of claim 34 wherein the other reactant is dimethyl aluminum hydride.

* * * * *